(12) United States Patent
Sai et al.

(10) Patent No.: US 12,103,836 B2
(45) Date of Patent: Oct. 1, 2024

(54) STACKER CRANE

(71) Applicant: MURATA MACHINERY, LTD., Kyoto (JP)

(72) Inventors: Jun Sai, Ise (JP); Kazuhiro Ishikawa, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 305 days.

(21) Appl. No.: 17/776,621

(22) PCT Filed: Sep. 24, 2020

(86) PCT No.: PCT/JP2020/036048
§ 371 (c)(1),
(2) Date: May 13, 2022

(87) PCT Pub. No.: WO2021/100313
PCT Pub. Date: May 27, 2021

(65) Prior Publication Data
US 2022/0402737 A1 Dec. 22, 2022

(30) Foreign Application Priority Data
Nov. 22, 2019 (JP) ................. 2019-211508

(51) Int. Cl.
| B65G 1/04 | (2006.01) |
| B66F 9/07 | (2006.01) |
| B66F 9/08 | (2006.01) |

(52) U.S. Cl.
CPC .............. B66F 9/08 (2013.01); B65G 1/0407 (2013.01); B66F 9/07 (2013.01)

(58) Field of Classification Search
CPC .......... B66F 9/08; B66F 9/07; B66F 9/07504; B66F 9/0755; B66F 9/12; B65G 1/0407;
(Continued)

(56) References Cited

U.S. PATENT DOCUMENTS

| 2003/0098207 A1* | 5/2003 | Tai ............................ B66F 9/07 187/222 |
| 2015/0159369 A1 | 6/2015 | Chen et al. |
| 2018/0076059 A1* | 3/2018 | Abe .................. H01L 21/67775 |

FOREIGN PATENT DOCUMENTS

| DE | 197 04 019 A1 | 12/1997 |
| DE | 10 2005 007 226 A1 | 8/2006 |

(Continued)

OTHER PUBLICATIONS

Official Communication issued in European Patent Application No. 20890702.2, mailed on Nov. 13, 2023.

*Primary Examiner* — Lynn E Schwenning
*Assistant Examiner* — Lucia Elba Rodriguez
(74) *Attorney, Agent, or Firm* — Keating & Bennett, LLP

(57) ABSTRACT

A coupling structure includes an outer member attached over first and second column members, a first inner member between the first column member and the outer member, a second inner member between the second column member and the outer member, a first fixing member to fix the outer member to the first column member along with the first inner member, a second fixing member to fix the outer member to the second column member along with the second inner member, a third fixing member to fix the first inner member to the first column member, and a fourth fixing member to fix the second inner member to the second column member. The outer member and the first inner member are provided with a first positioner, and the outer member and the second inner member are provided with a second positioner.

5 Claims, 11 Drawing Sheets

(58) Field of Classification Search
CPC .. B65G 1/04; H01L 21/6773; H01L 21/67769
See application file for complete search history.

(56) References Cited

FOREIGN PATENT DOCUMENTS

| | | | | | |
|---|---|---|---|---|---|
| JP | 08225111 A | * | 9/1996 | | |
| JP | 2007-291682 A | | 11/2007 | | |
| JP | 4826941 B2 | | 11/2011 | | |
| WO | WO-2012060146 A1 | * | 5/2012 | ....... | H01L 21/67769 |

* cited by examiner

[FIG. 1]
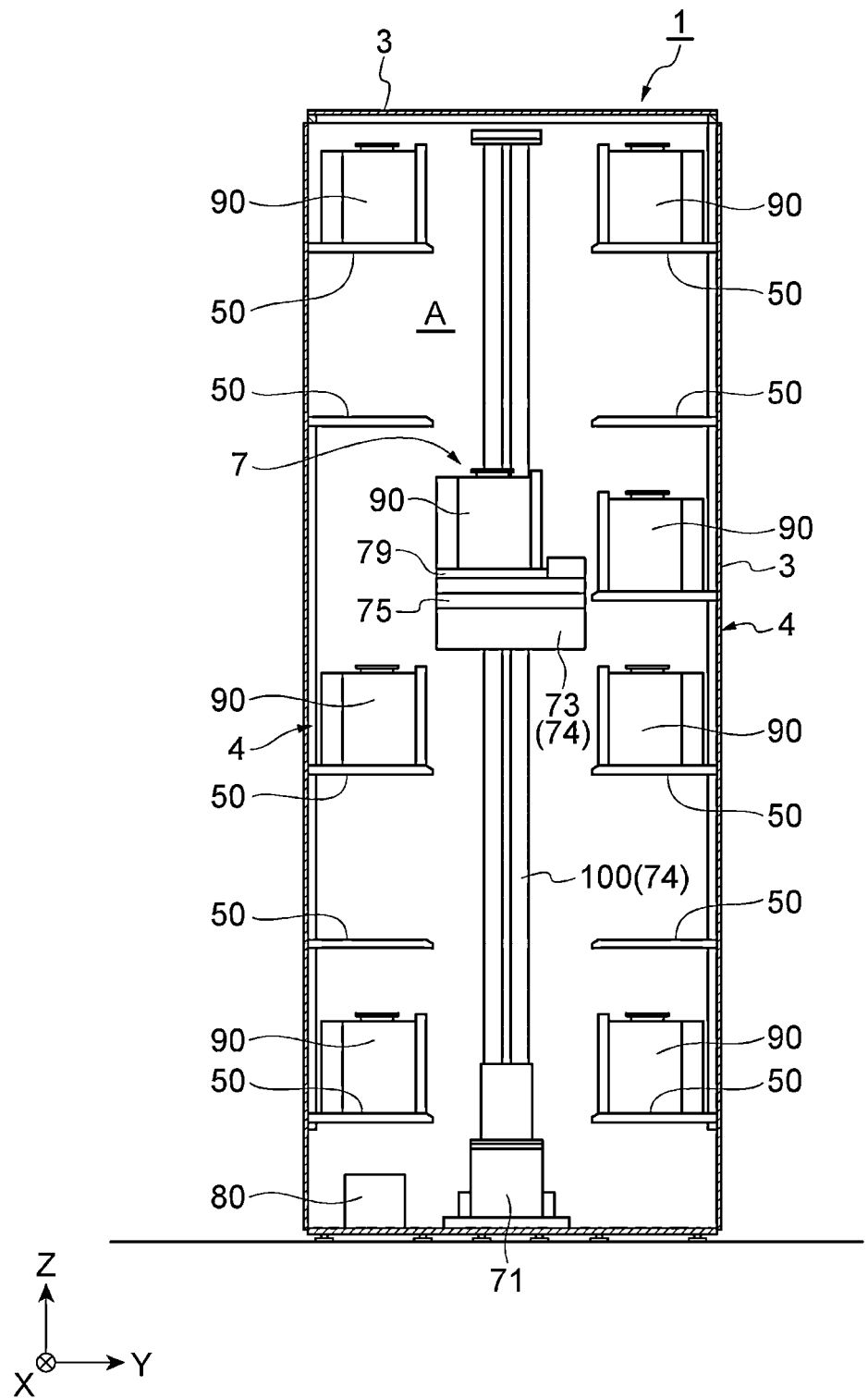

[FIG. 2]
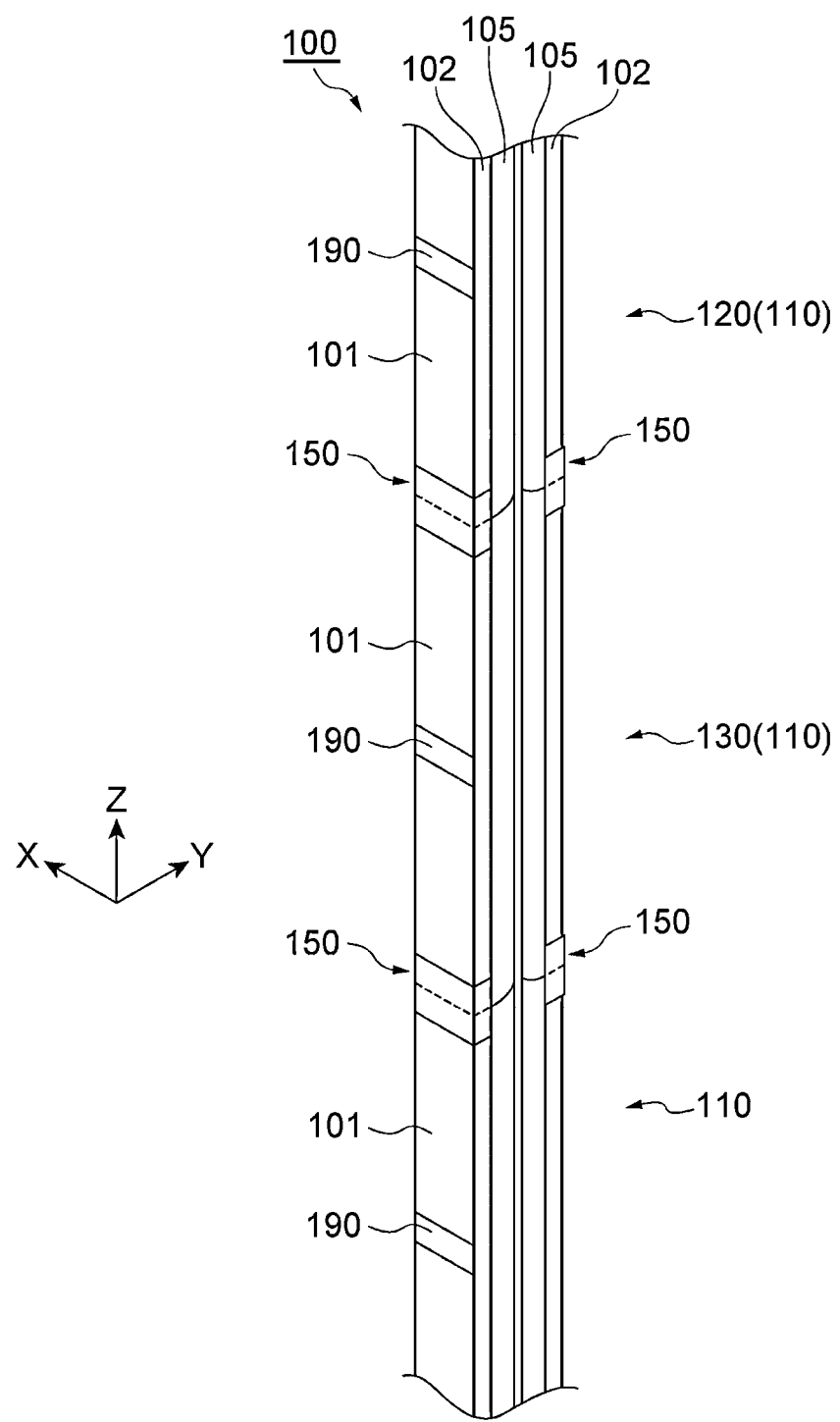

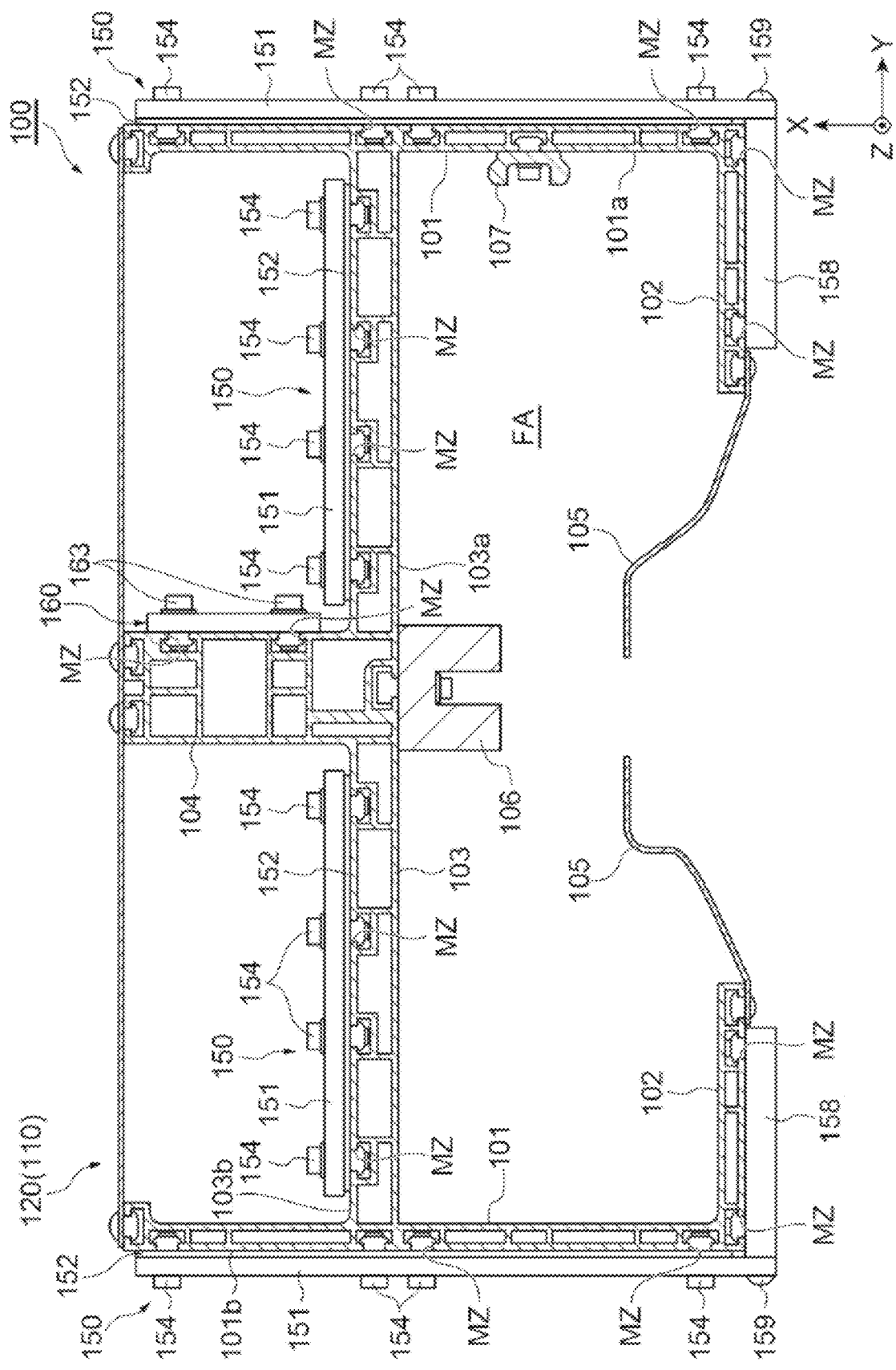

[FIG. 4]
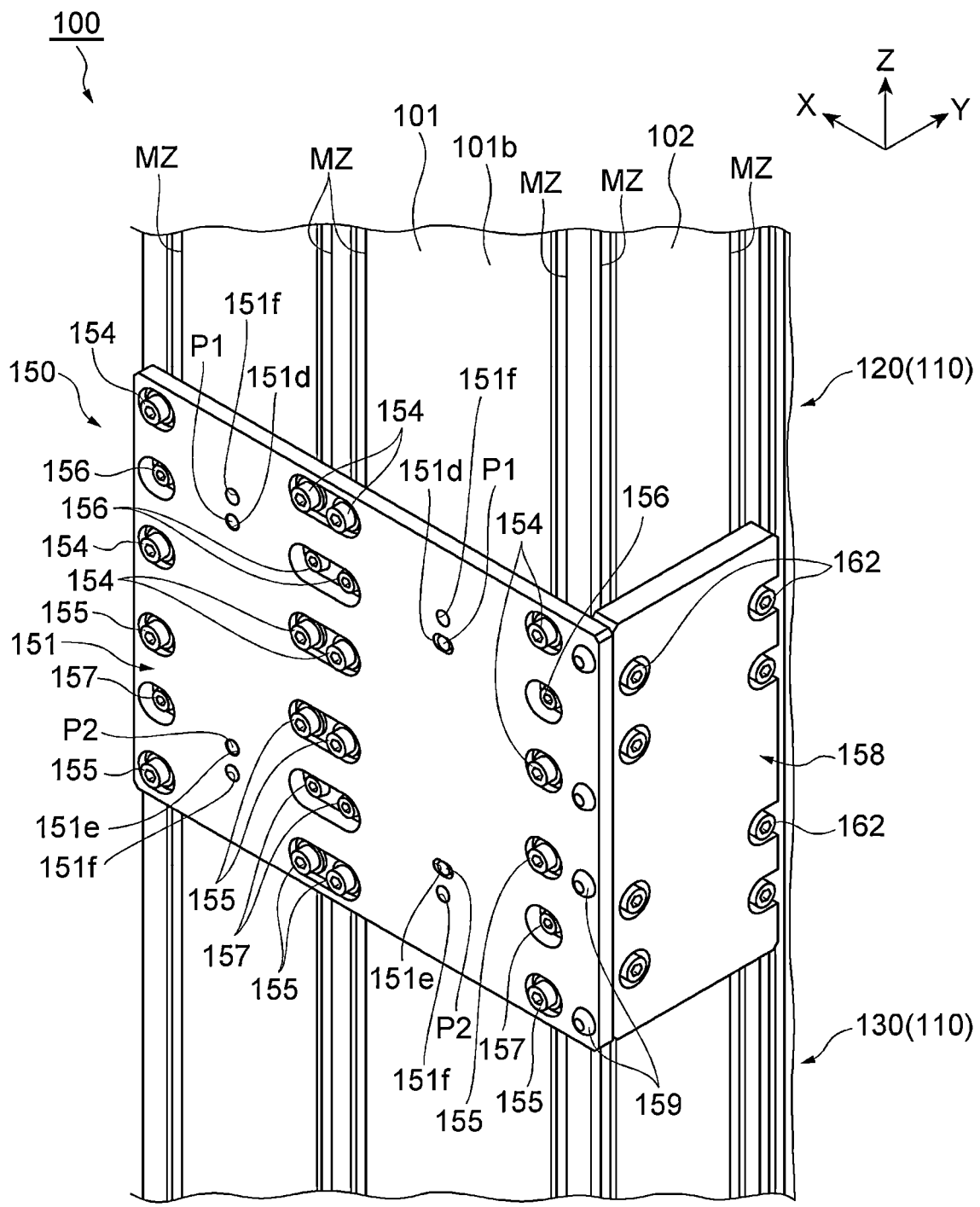

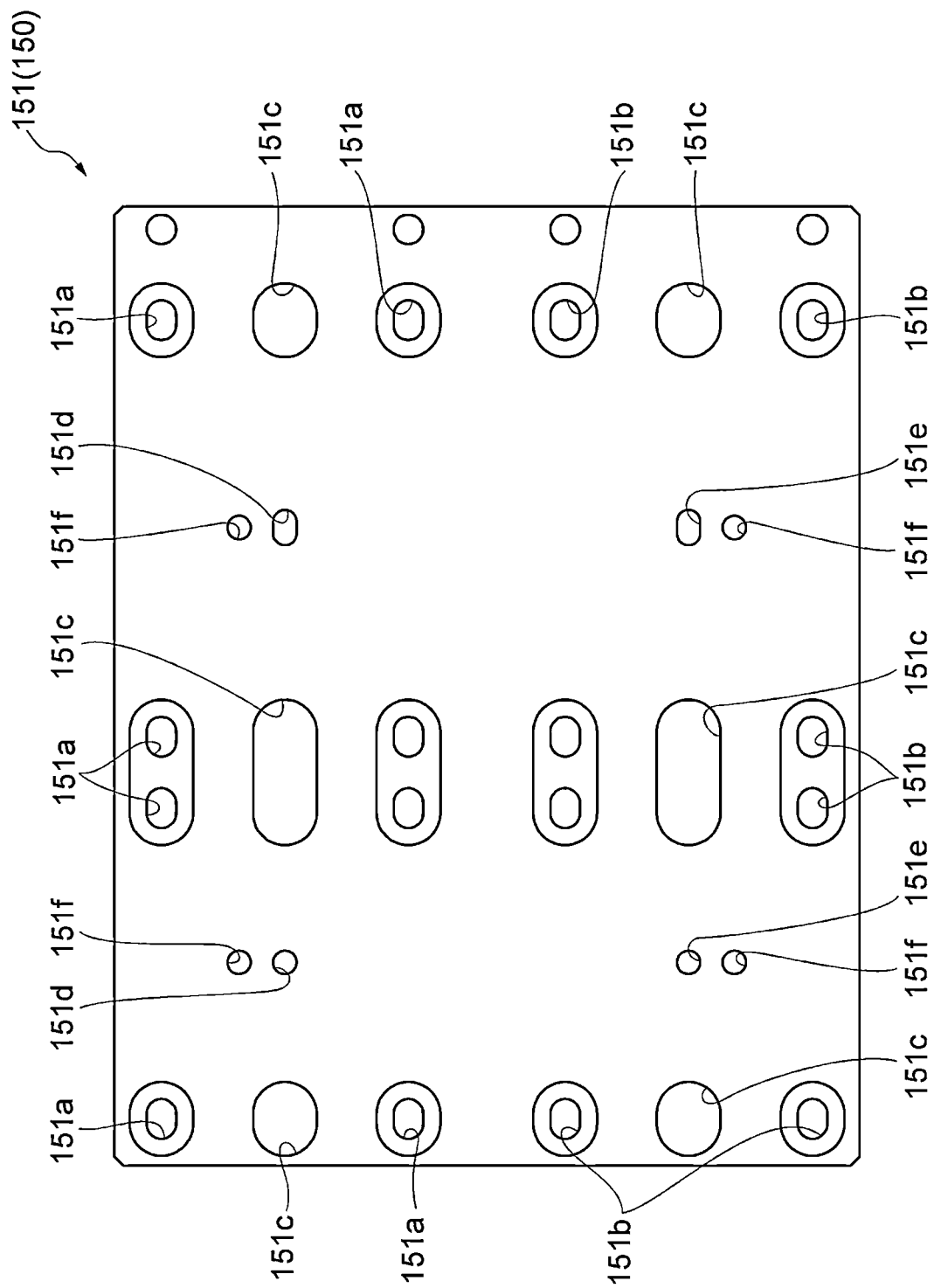
[FIG. 5]

[FIG. 6]
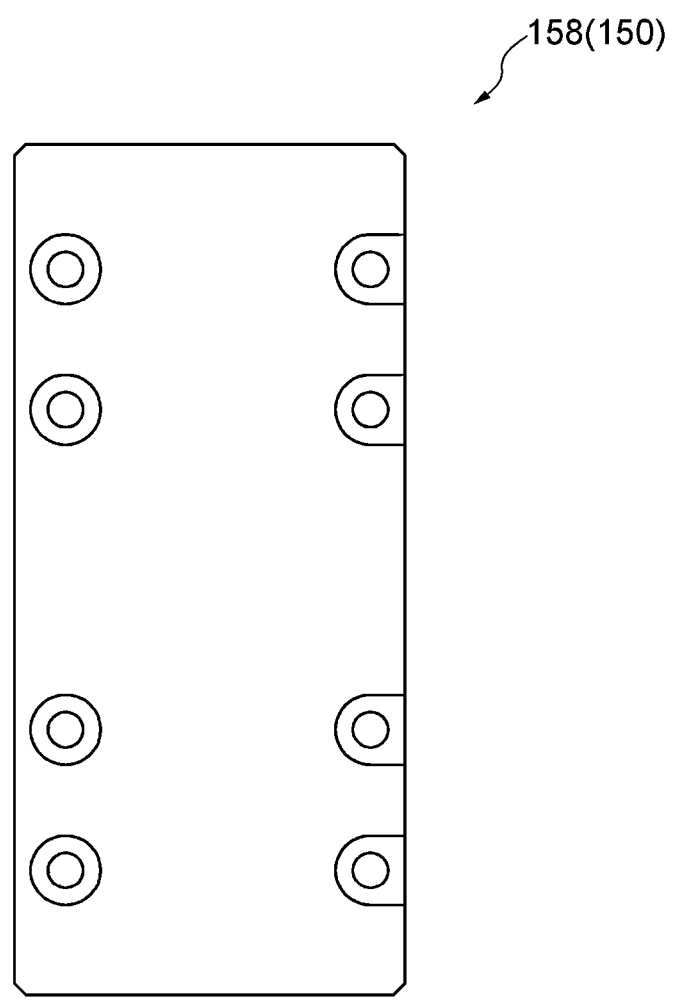

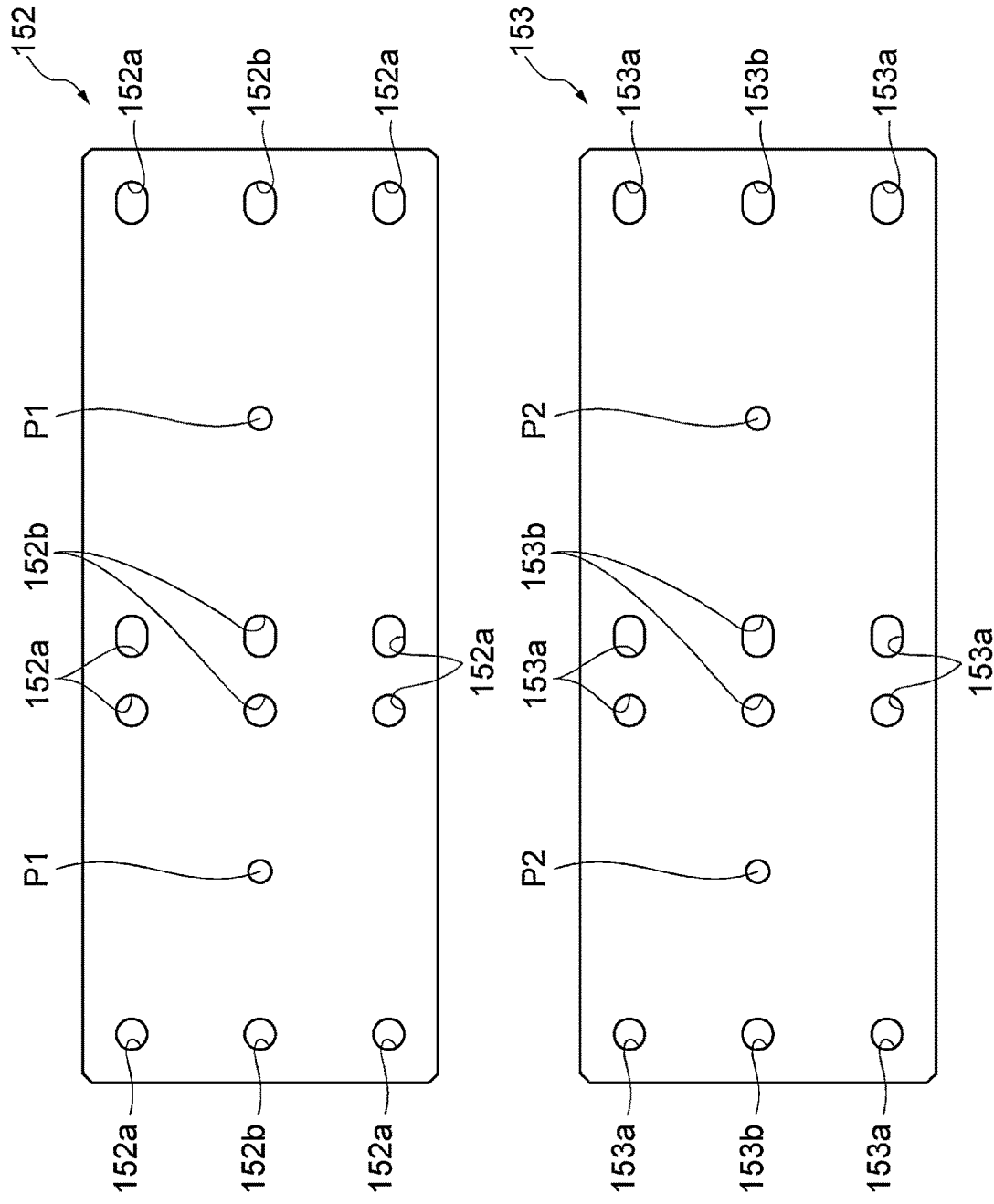

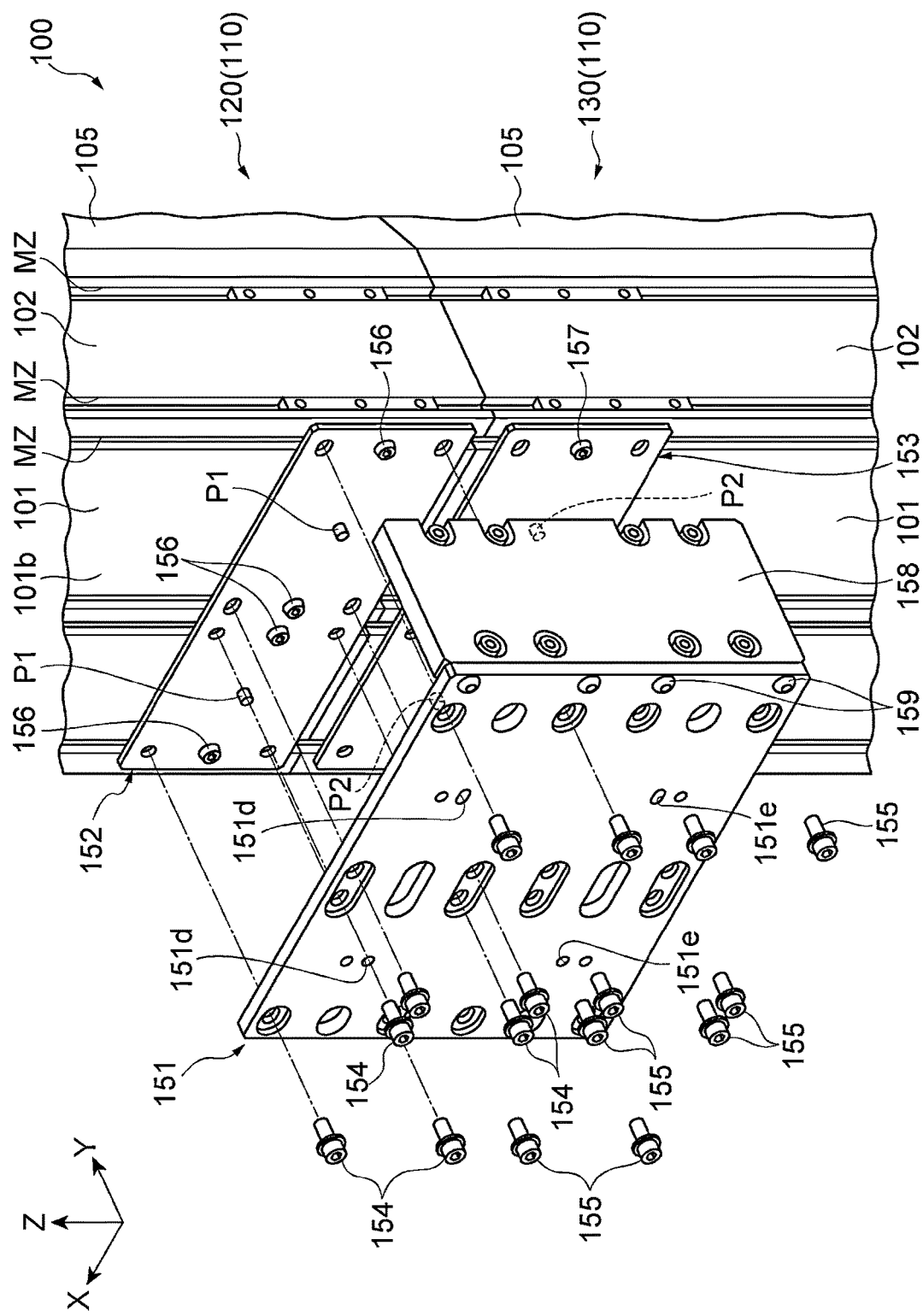
[FIG. 8]

[FIG. 9]
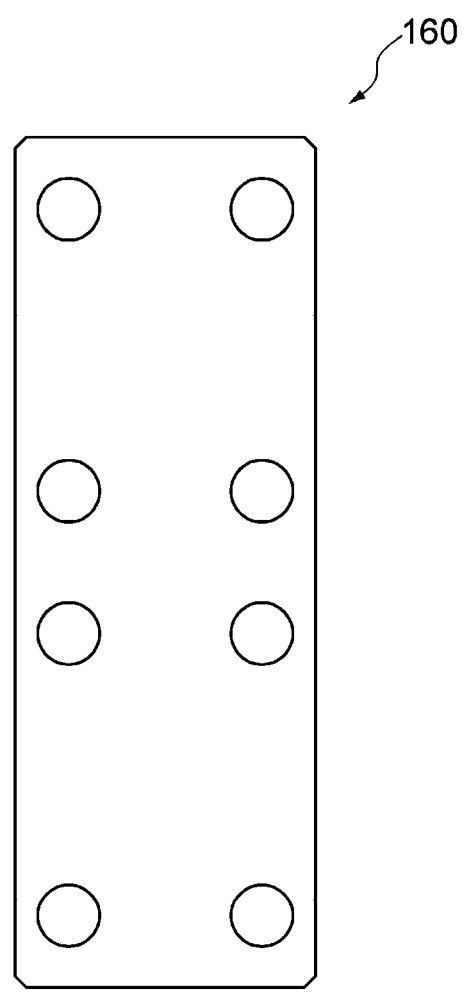

[FIG. 10]
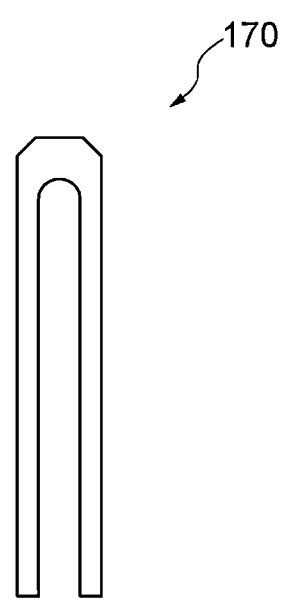

[FIG. 11A]
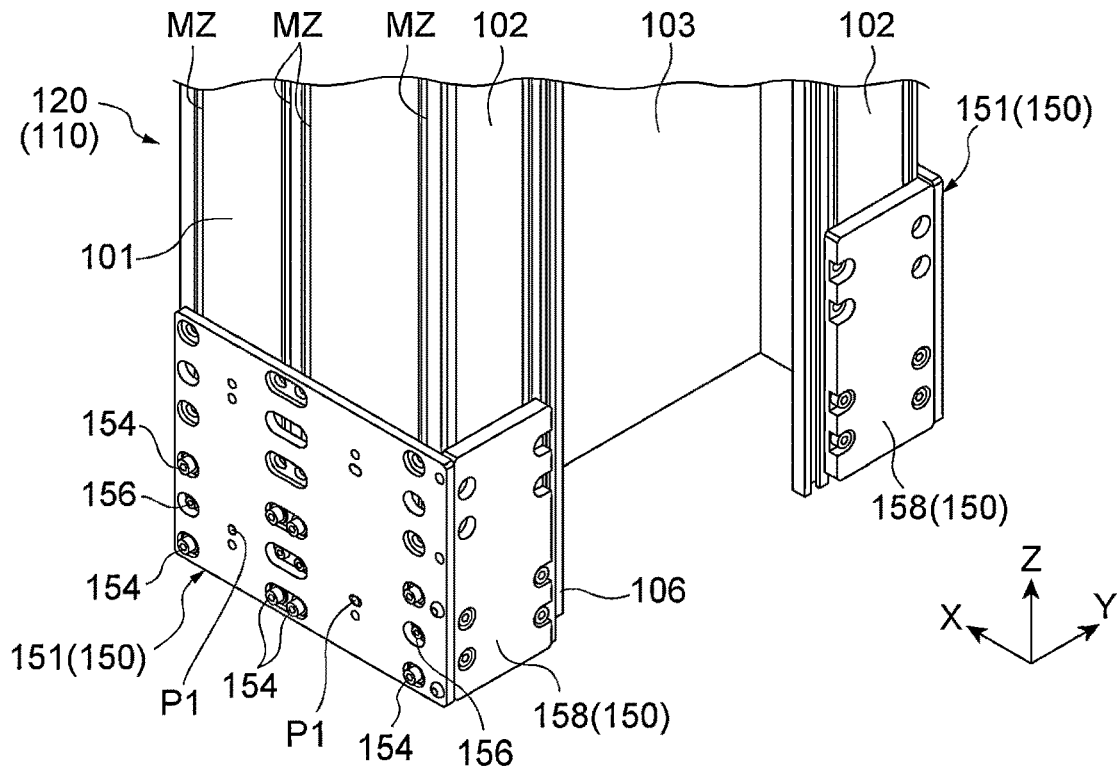
[FIG. 11B]
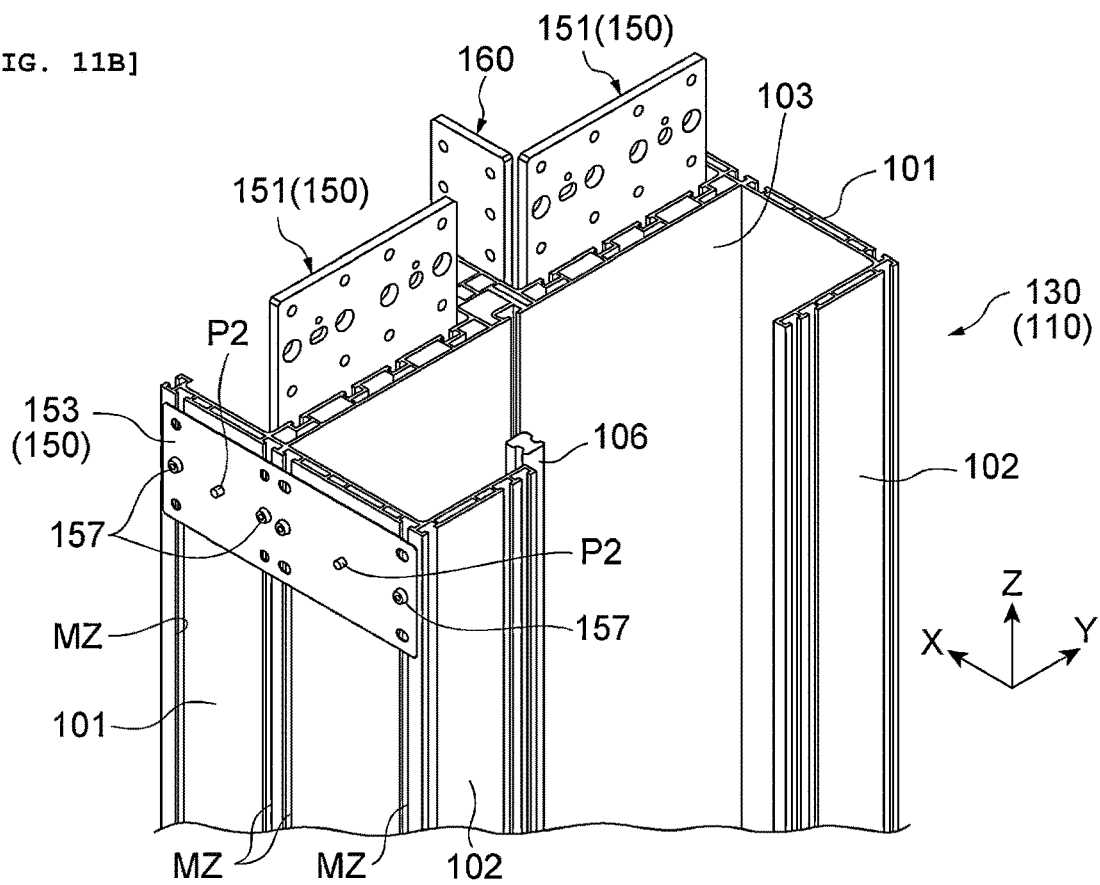

STACKER CRANE

BACKGROUND OF THE INVENTION

1. Field of the Invention

An aspect of the present invention relates to stacker crane.

2. Description of the Related Art

For example, Japanese Patent No. 4826941 shows a stacker crane including a mast including a plurality of column members coupled with each other in a height direction and an elevating platform moving up and down along the mast.

SUMMARY OF THE INVENTION

In the stacker crane as described above, the plurality of column members are included in the mast. After a locational relationship between the plurality of column members is adjusted and the column members are coupled, for example, at a factory, the coupled column members are decoupled and delivered to and recoupled at an installation site. The plurality of column members are recoupled so as to replicate the adjusted locational relationship. However, time and effort for the replication of the locational relationship may be required.

Preferred embodiments of the present invention provide stacker cranes each capable of easily replicating an adjusted locational relationship when the plurality of column members are coupled at an installation site.

A stacker crane according to an aspect of a preferred embodiment of the present invention includes a mast that includes a plurality of column members coupled with each other in a height direction and an elevating platform movable up and down along the mast. The stacker crane includes a coupling structure to couple a first column member and a second column member of the plurality of column members, which are adjacent to each other. The coupling structure includes an outer member attached over the first column member and the second column member, a first inner member arranged between the first column member and the outer member, a second inner member arranged between a second column member and the outer member, a first fixing member to fix the outer member with the first inner member to the first column member, a second fixing member to fix the outer member with the second inner member to the second column member, a third fixing member to fix the first inner member to the first column member, and a fourth fixing member to fix the second inner member to the second column member. The outer member and the first inner member are provided with a first positioner to specify a locational relationship between the outer member and the first inner member, and the outer member and the second inner member are provided with a second positioner to specify a locational relationship between the outer member and the second inner member.

For example, at a factory, in the stacker crane, after a locational relationship is adjusted and the first column member and the second column member are coupled with the coupling structure, the first fixing member and the second fixing member are removed in order to release the coupled members, so that the outer member can be removed from the first inner member and the second inner member and at the same time the first inner member and the second inner member can remain fixed to the first column member and the second column member, respectively. At an installation site, the first fixing member and the second fixing member are reinstalled and the outer member is fixed to the first inner member and the second inner member, so that the first column member and the second column member can be recoupled. The first and the second positioning units specify the locational relationships between the outer member and the first inner member and between the outer member and the second inner member, so that the first column member and the second column member are coupled in accordance with the locational relationship adjusted at the factory. Therefore, when a plurality of the column members are coupled at an installation site, the adjusted locational relationship can be easily replicated.

In a stacker crane according to an aspect of a preferred embodiment of the present invention, the first positioner may include a first hole on one of the outer member and the first inner member and a first pin at one of the outer member and the first inner member and fitted into the first hole, and the second positioning unit may include a second hole on one of the outer member and the second inner member and a second pin at one of the outer member and the second inner member and fitted into the second hole. With this configuration, the first pin is fitted with the first hole, so that the locational relationship between the outer member and the first inner member can be specified. The second pin is fitted with the second hole, so that the locational relationship between the outer member and the second inner member can be specified.

In a stacker crane according to an aspect of a preferred embodiment of the present invention, a plurality of the first holes and a plurality of the first pins are provided and a plurality of the second holes and a plurality of the second pins are provided. Any of the plurality of the first holes and any of the second holes may be elongated holes. With this configuration, the first pin can be easily fitted with the first hole and the second pin can be easily fitted with the second hole.

In a stacker crane according to an aspect of a preferred embodiment of the present invention, the coupling structure may include a shim plate between the first inner member and the first column member or between the second inner member and the second column member. After being fixed to the first column member, the first inner member does not need to be removed and after being fixed to the second column member, the second inner member does not need to be removed, so that the shim plate therebetween does not need to be removed once being fixed. Therefore, when the plurality of column members are coupled at an installation site, the shim plate does not need to be managed and the adjusted locational relationship can be replicated more easily.

In a stacker crane according to an aspect of a preferred embodiment of the present invention, the coupling structure may be provided on at least any of a side wall and a back wall of the first column member and the second column member. With this configuration, the first column member and the second column member can be coupled accurately.

In a stacker crane according to an aspect of a preferred embodiment of the present invention, the coupling structure provided on the side wall of the first column member and the second column member further includes a front member coupled with the outer member and fixed to a front wall of the first column member and the second column member. With this configuration, any deformation of the mast can be prevented effectively.

Preferred embodiments of the present invention provide stacker cranes each capable of easily replicating an adjusted locational relationship when a plurality of the column members are coupled at an installation site.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a sectional view showing a stocker including a stacker crane according to a preferred embodiment of the present invention.

FIG. 2 is a perspective view showing a mast.

FIG. 3 is a flat sectional view showing a mast.

FIG. 4 is a perspective view showing a coupling structure.

FIG. 5 is a view showing an outer member of the coupling member seen from a width direction.

FIG. 6 is a view showing a front side member of the coupling structure seen from the width direction.

FIG. 7A is a view of a first inner member of the coupling structure seen from a width direction. FIG. 7B is a view of a second inner member of the coupling structure seen from the width direction.

FIG. 8 is an exploded perspective view showing the coupling structure.

FIG. 9 is a view showing an intermediate wall coupling plate seen from the width direction.

FIG. 10 is a view of a shim plate seen from the width direction.

FIGS. 11A and 11B are perspective views for explaining an example of mast installation.

DETAILED DESCRIPTION OF THE PREFERRED EMBODIMENTS

Hereinafter, with reference to the drawings, preferred embodiments will be described. In the description of the drawings, the same elements will be denoted by the same reference signs, without redundant description. Words 'up' and 'down' correspond to an upper direction and a lower direction of a vertical direction, respectively.

A stocker including a stacker crane according to a preferred embodiment will be now described. As shown in FIG. 1, a stocker 1 functions as a storage to store a container (e.g., a transported article) 90 such as a FOUP (Front Opening Unified Pod) to store articles such as semiconductor wafers or glass substrates. The stocker 1 is provided, for example, at a clean room. The stocker 1 includes a stocker body 3, a rack 4, a stacker crane 7, and a controller 80.

The stocker body 3 defines an inner space A of the stocker 1 and includes a plurality of partitions. The racks 4 store the container 90 and are generally provided in one or two rows (for example, two rows in the present preferred embodiment). Each rack 4 extends in an X direction (a width direction) and two adjacent racks 4 are arranged in parallel or substantially in parallel so as to face each other. Each rack 4 includes a plurality of shelves 50 where the container 90 is placed and stored. The shelves 50 are arranged along the X direction and a Z direction (a vertical direction).

The stacker crane 7 is a mechanism to load/unload the container 90 to/from each of the shelves 50 and to transfer between a loading port (not illustrated) and an unloading port (not illustrated) and each of the shelves 50 or between shelves 50. The stacker crane 7 is disposed in the area between two of the racks 4, 4 facing each other. The stacker crane 7 is capable of traveling on a rail (not illustrated) disposed in a floor along an extending direction (the X direction) of the rack 4 to move along the rack 4 in the X direction.

The stacker crane 7 includes a travel unit 71, an elevator 74, a rotation unit 75, and a hand 79. The travel unit 71 is capable of traveling along a rail in the X direction by a travel driver such as a motor. The elevator 74 includes a mast 100 and an elevating platform 73. The mast 100 is provided at the travel unit 71 and extends in the Z direction. The elevating platform 73 is capable of moving up and down along the mast 100 by being driven by an elevation driver such as a motor. The rotation unit 75 rotates the hand 79 mounted on the rotation unit 75 around an axis along Z direction.

The hand 79 places the container 90. The hand 79 is provided at the elevating platform 73. The hand 79 advances and retreats (advances outward from the elevating platform 73 and retreats on the elevating platform 73 in a plan view) to transfer the container 90 by use of a transfer device (not illustrated). Configurations, mechanisms, and locations of the travel unit 71, the elevator 74, the rotation unit 75, and the hand 79 are not specifically limited. Any known mechanisms or devices are adoptable for the travel unit 71, the elevator 74, the rotation unit 75, and the hand 79.

The controller 80 is configured or programmed to control components or portions of the stacker crane 7. The controller 80 is located, e.g., in the stocker body 3. The controller 80 includes a CPU (Central Processing Unit), a RAM (Random Access Memory), and a ROM (Read Only Memory). The controller 80 is capable of performing control operations in cooperation between hardware such as CPU, RAM, and ROM, and software such as program.

The mast 100 of the stacker crane 7 will be described as follows.

As shown in FIG. 2, the mast 100 includes a plurality of column members 110 coupled in the Z direction (a height direction). The column members 110 are elongated in the Z direction and arranged adjacently in the Z direction so as to face each other. The stacker crane 7 includes a plurality of coupling structures 150 to couple a pair of the column members 110 adjacent to each other in the Z direction.

As shown in FIG. 3, each of the column members 110 includes a pair of side walls 101 extending in the X direction seen from the Z direction and facing each other in the Y direction. Each of front walls 102 are provided at a front side (one side of the X direction) of each of the pair of side walls 101 so as to bend from each of the pair of side walls 101 to an inner side in the Y direction and connect with each of the pair of side walls 101. The pair of front walls 102 extend in the Y direction seen from the Z direction. A back wall 103 is provided backward from a center of the pair of side walls 101 in the X direction between the pair of side walls 101. The back wall 103 extends in the Y direction seen from the Z direction. A rear side middle wall 104 is provided so as to divide a back side space defined by the side walls 101 and the back wall 103 at a center of the back wall 103 in the Y direction. The rear middle wall 104 extends in the X direction seen from the Z direction.

A cover 105 extending in the Y direction is provided at an end of an inner side of each of the pair of front walls 102 in the Y direction. A front space FA is defined by the side wall 101, the front wall 102, and the cover 105. A rail 106 for the elevating platform 73 (FIG. 1) and a rail 107 for a balance weight (not illustrated) to balance with the evaluating platform 73 are arranged so as to extend in the Z direction. The rail 106 is provided on a front surface 103a of the back wall 103. The rail 107 is provided on an inner surface 101a of any one of the side walls 101. Hereinafter, an optional one of the plurality of column members 110 is referred to as an upper column member (first column member) 120 and another optional one of the plurality of column members 110, which is adjacent to a bottom side of the upper column member 120, is referred to as a lower column member (second column member) 130.

Next, a structure to couple between the upper column member 120 and the lower column member 130 with each other will be now described as follows.

Each of the coupling structures 150 is provided at each of an outer surfaces 101b of the pair of side walls 101 in the upper column member 120 and the lower column member 130. As shown in at least any of FIG. 3 to FIG. 8, each of the coupling structures 150 has a double plate structure including an outer side and an inner side. Each of the coupling structures 150 includes an outer member 151, a first inner member 152, a second inner member 153, a first fixing member 154, a second fixing member 155, a third fixing member 156, and a fourth fixing member 157.

As shown in FIG. 3, FIG. 4, FIG. 5, and FIG. 8, the outer member 151 is a rectangular member attached across the upper column member 120 and the lower column member 130. The outer member 151 is made of, e.g. an aluminum, which is a metal generally having a high flatness. The outer member 151 abuts the first inner member 152 and the second inner member 153. The outer member 151 includes first fixing holes 151a in which the first fixing members 154 are inserted, second fixing holes 151b in which the second fixing members 155 are inserted, through holes 151c to avoid an interference between the third members 156 fixing the first inner member 152 and the fourth fixing members 157 fixing the second inner member 153, a pair of first holes 151d into which a pair of first pins P1 (to be described later) of the first inner member 152 fit, a pair of second holes 151e into which a pair of second pins P2 (to be described later) of the second inner member 153 fit, and tapped holes 151f provided around the first holes 151d and the second holes 151e.

The first fixing hole 151a is provided, e.g. in a grid shape on an upper portion of the outer member 151. The second fixing hole 151b is provided, e.g. in a grid shape on a lower portion of the outer member 151. The through hole 151c is a space to expose a head of the third fixing member 156 fixing the first inner member 152 and a head of the fourth fixing member 157 fixing the second inner member 153. The through hole 151c is located between the first fixing holes 151a adjacent to each other in Z direction in the outer member 151 and between the second fixing holes 151b adjacent to each other in Z direction therein.

The first hole 151d preferably has a cross-sectional shape corresponding to the first pin P1 of the first inner member 152 at a position corresponding to the first pin P1. The first pin P1 is pressed into the first hole 151d, and tightened to fit into the first hole 151d. The first hole 151d is provided in each space among three of the through holes 151c located at the upper portion of the outer member 151. One of a pair of the first holes 151d is a perfectly circular hole. The other of the pair of the first holes 151d is an elongated hole so that a direction in which the pair of first holes 151d are lined up becomes a longitudinal direction.

The second holes 151e preferably has a cross-sectional shape corresponding to the second pin P2 of the second inner member 153 at a position corresponding to the second pin P2. The second hole 151e is a circular hole. The second pin P2 is pressed into the second hole 151e, and tightened to fit into the second hole 151e. The second hole 151e is provided in each space among three of the through holes 151c located at the lower portion of the outer member 151. One of the pair of a second holes 151e is a perfectly circular hole. The other of the pair of a second holes 151e is an elongated hole so that a direction in which a pair of the second holes 151e are lined up becomes a longitudinal direction.

The tapped hole 151f is provided around each of the first hole 151d and the second hole 151e. The tapped holes 151f are screw holes used to pull out the first pins P1 from the first holes 151d and to pull out the second pins P2 from the second holes 151e.

As shown in FIG. 3, FIG. 4, FIG. 6, and FIG. 8, the coupling structure 150 provided at the side wall 101 further includes a front member 158. The front member 158 is a rectangular member attached over the upper column member 120 and the lower column member 130. The front member 158 abuts a front wall 102 of the upper column member 120 and the lower column member 130. The front member 158 is made of, e.g. aluminum. The front member 158 is coupled with the outer member 151 at an inner side of a front end of the outer member 151 with a screw 159 so as to be perpendicular to the outer member 151. The front member 158 is fixed to the front wall 102 with a bolt 162. The fixation (tightening) of the member 158 to the front wall 102 is enabled by use of a vertical groove MZ provided on the upper column member 120 and the lower column member 130.

As shown in FIG. 3, FIG. 4, FIG. 7A, and FIG. 8, the first inner member 152 is a rectangular member arranged between the upper column member 120 and the outer member 151. The first inner member 152 is made of, e.g. a stainless steel which is a low-cost metal with a high stiffness. The first inner member 152 abuts the side wall 101 of a lower end of the upper column member 120. The first inner member 152 includes a first fixing hole 152a in which the first fixing member 154 is inserted, a third fixing hole 152b in which the third fixing member 156 is inserted, and a pair of the first pins P1 fitting into the first holes 151d of the outer member 151.

The first fixing hole 152a is provided at a position capable of communicating with the first fixing hole 151a of the outer member 151 at an edge of the first inner member 152. The third fixing hole 152b is provided at a position capable of being located within a through hole 151c of the outer member 151 on the first inner member 152. The third fixing hole 152b is provided between the first fixing holes 152a adjacent in Z direction on the first inner member 152.

The first pin P1 preferably has a cross-sectional shape corresponding to the first hole 151d at a position corresponding to the first hole 151d of the outer member 151 on the first inner member 152. The first pin P1 preferably has a cylindrical shape. The first pin P1 is located between the adjacent third fixing holes 152b on the first inner member 152. The first pin P1 is pressed into the first hole 151d, and tightened to fit into the first hole 151d. The first pin P1 protrudes longer than the thickness of the outer member 151. The first pin P1 is fixed to the first inner member 152, for example, by being welded. A method to fix the first pin P1 is not limited to welding. Other methods can be used for the fixation of the first pin P1.

As shown in FIG. 3, FIG. 4, FIG. 7B, and FIG. 8, the second inner member 153 is a rectangular member between the lower column member 130 and the outer member 151. The second inner member 153 is made of, e.g. a stainless steel, which is a low-cost metal with a high stiffness. The second inner member 153 abuts the side wall 101 of an upper end of the lower column member 130. The second inner member 153 includes a second fixing hole 153a in which the second fixing member 155 is inserted, a fourth fixing hole 153b in which the fourth fixing member 157 is inserted, and a pair of the second pins P2 fitting into the second holes 151e of the outer member 151.

The second fixing hole 153a is provided at a position capable of communicating with the second fixing hole 151b of the outer member 151 at an edge of the second inner member 153. The fourth fixing hole 153b is provided at a position capable of being located within a through hole 151c of the outer member 151 on the second inner member 153. The fourth fixing hole 153b is provided between the second fixing holes 153a adjacent in Z direction on the second inner member 153.

The second pin P2 preferably has a cross-sectional shape corresponding to the second hole 151e at a position corresponding to the second hole 151e of the outer member 151 on the first inner member 152. The second pin P2 preferably has a cylindrical shape. The second pin P2 is between the adjacent fourth fixing holes 153b on the second inner member 153. The second pin P2 is pressed into the second hole 151e, and tightened to fit into the second hole 151e. The second pin P2 protrudes longer than the thickness of the outer member 151. The second pin P2 is fixed to the second inner member 153, for example, by being welded. A method to fix the second pin P2 is not limited to welding. Other methods can be used for the fixation of the second pin P2.

As shown in FIG. 4 and FIG. 8, the first fixing member 154 fixes the outer member 151 along with the first inner member 152 to the upper column member 120. For example, a co-fastening bolt is used as the first fixing member 154. The first fixing members 154 are inserted into the first fixing holes 151a, 152a. The fixation (tightening) of the first fixing member 154 to the upper column member 120 is enabled by the use of the vertical groove MZ on the upper column member 120.

The second fixing member 155 fixes the outer member 151 along with the second inner member 153 to the lower column members 130. For example, a co-fastening bolt is used as the second fixing member 155. The second fixing member 155 is inserted into the second fixing hole 151b, 153a. The fixation (tightening) of the second fixing member 155 to the lower column member 130 is enabled by use of the vertical groove MZ on the lower column member 130.

The third fixing member 156 fixes the first inner member 152 to the upper column member 120. For example, a special screw (tamperproof screw) requiring a dedicated tool is used for the fixation and release as the third fixing member 156. The third fixing member 156 is inserted into the third fixing hole 152b. The fixation (tightening) of the third fixing member 156 to the upper column member 120 is enabled by use of the vertical groove MZ on the upper column member 120. The fourth fixing member 157 fixes the second inner member 153 to the lower column member 130. For example, a special screw (tamperproof screw) requiring a dedicated tool is used for fixation and release as the fourth fixing member 157. The fourth fixing member 157 is inserted into the fourth fixing holes 153b. The fixation (tightening) of the fourth fixing member 157 to the lower column member 130 is enabled by use of the vertical groove MZ on the lower column member 130. The heads of the third fixing member 156 and the fourth fixing member 157 are exposed within the through hole 151c of the outer member 151.

In the above-described coupling structure 150, the first pin P1 of the first inner member 152 and the first hole 151d of the outer member 151 include a first positioning unit to specify a locational relationship between the outer member 151 and the first inner member 152. The second pin P2 of the second inner member 153 and the second hole 151e of the outer member 151 include a second positioning unit to specify a locational relationship between the outer member 151 and the second inner member 153.

As shown in FIG. 3 and FIG. 9, the stacker crane 7 further includes an intermediate wall coupling plate 160 as a coupler to couple between the upper column member 120 and the lower column member 130. The intermediate wall coupling plate 160 is a rectangular member attached over the upper column member 120 and the lower column member 130. The intermediate wall coupling plate 160 abuts the rear intermediate wall 104 of each of the upper column member 120 and the lower column member 130. The intermediate wall coupling plate 160 is made of, e.g. an aluminum. The intermediate wall coupling plate 160 is fixed to the rear intermediate wall 104 of each of the upper column member 120 and the lower column member 130 with a bolt 163. The fixation (tightening) of the intermediate wall coupling plate 160 to the rear intermediate wall 104 is enabled by use of the vertical groove MZ on the rear intermediate wall 104.

As shown in FIG. 10, the coupling structure 150 includes a shim plate 170 between the first inner member 152 and the upper column member 120 and between the second inner member 153 and the lower column member 130. The shim plate is a U-shaped plate seen from its width direction. The shim plate 170 is structured such that one or more third fixing members 156 or one or more fourth fixing members 157 are located inside the U-shaped plate (such that the third fixing member 156 or the fourth fixing member is surrounded by the U-shaped plate) seen from its width direction. The shim plate 170 with an appropriate thickness is selected for use from a plurality of the shim plates with various thicknesses or the number of the shim plates to be used is selected. The shim plate 170 adjusts so that a surface of the first inner member 152 and a surface of the second inner member 153 can be located on a same vertical plane.

Returning to FIG. 3, in the stacker crane 7, the coupling structure 150 is also provided at a back surface 103b of the back wall 103 of each of the upper column member 120 and the lower column member 130. The back surface 103b is divided into one side and the other side in the Y direction by the rear immediate wall 104. The coupling structure 150 provided at the back wall 103 is provided at each of the one side and the other side. The coupling structure 150 provided at the back wall 103 is configured similarly to the coupling structure 150 provided at the side wall 101 except for a point that the front member 158 is not provided.

Hereinafter, an example of a case that the mast 100 is installed at an installation site will be now described.

For example, at a production site such as a factory, the pair of the first pins P1 are fitted into and overlapped with the pair of the first holes 151d of the outer member 151. At the same time, the pair of the second pin P2 of the second inner member 153 are fitted with and overlapped with the pair of the second holes 151e of the outer member 151. Therefore, a sub-assembly of the coupling structure 150 including the outer member 151, the first inner member 152, and the second inner member 153 assembled is obtained.

The outer member 151 and the first inner member 152 in the sub-assembly are tightened jointly and fixed to the upper column member 120 with the first fixing members 154. The outer member 151 and the second inner member 153 in the sub-assembly is tightened jointly and fixed to the lower column member 130 with the second fixing members 155. Only the first inner member 152 in the sub-assembly is fixed to the upper column member 120 with the third fixing members 156. Only the second inner member 153 in the sub-assembly is fixed to the lower column member 130 with the fourth fixing members 157. Therefore, the upper column member 120 and the lower column member 130 are coupled by the coupling structure 150.

As needed, the shim plate 170 is intervened between the first inner member 152 and the upper column member 120 and the second inner member 153 and the lower column member 130 to adjust a locational relationship between the upper column member 120 and the lower column member 130. The intermediate wall coupling plate 160 is fixed to the rear intermediate wall 104 of each of the upper column member 120 and the lower column member 130, so that the upper column member 120 and the lower column member 130 are coupled.

Next, the first fixing members 154 and the second fixing members 155 are removed. Using the tapped hole 151ƒ of the outer member 151, the outer member 151 is removed from the first inner member 152 and the second inner member 153 while the first inner member 152 and the second inner member 153 are fixed to the upper column member 120 and the lower column member 130. The intermediate wall coupling plate 160 is removed from the upper column member 120 and the lower column member 130. As a result, the upper column member 120 and the lower column member 130 are decoupled. The upper column member 120 and the lower column member 130 remaining decoupled are delivered and transferred to an installation site (also referred to as 'field' or 'installation field').

At this step, for example, shown in FIGS. 11A and 11B, in the coupling structure 150 provided at the back wall 103, the outer member 151 may remain fixed to the lower column member 130. In addition, the intermediate wall coupling plate 160 may remain fixed to the lower column member 130. As a result, the outer member 151 and the intermediate wall coupling plate 160 can function as a guide to abut the upper column member 120 and the lower column member 130 on each other when recoupling (to be described later).

In the coupling structure 150 provided at the side wall 101, after being once removed, the outer member 151 may be offset upward and temporarily fixed to the upper column member 120 as illustrated. Specifically, after the outer member 151 is removed from the first inner member 152 and the second inner body 153, the outer member 151 is moved upward to approximately a half of a vertical width thereof. The first fixing member 154 is inserted into the second fixing hole 151b and then the outer member 151 may be fixed to the upper column member 120 along with the first inner member 152, thus enabling improvement of a handling ability of the coupling structure 150.

Then, at the installation site, the upper column member 120 and the lower column member 130 are recoupled. Specifically, the standing upper column member 120 is moved horizontally from a front side of the standing lower column member 130 close to each other and the upper column member 120 and the lower column member 130 are arranged to abut on each other in Z direction. The pair of first pins P1 of the first inner member 152 is fitted and overlapped with the pair of first holes 151d of the outer member 151 and the pair of second pins P2 of the second inner member 153 is fitted and overlapped with the pair of second holes 151e of the outer member 151. The outer member 151 and the first inner member 152 are tightened together and fixed to the upper column member 120 with the first fixing member 154, and the outer member 151 and the second inner member 153 are tightened together and fixed to the lower column member 130 with the second fixing member 155. The intermediate wall coupling plate 160 is fixed to the rear intermediate wall 104 of each of the upper column member 120 and the lower column member 130. As a result, the upper column member 120 and the lower column member 130 are recoupled and the installation of the mast 100 is completed.

For example, at a factory, in the stacker crane 7, after the locational relationship is adjusted and the upper column member 120 and the lower column member 130 are coupled with each other by the coupling structure 150. In releasing this coupled members, the first fixing member 154 and the second fixing member 155 are removed, so that the outer member 151 can be removed from the first inner member 152 and the second inner member 153 and the first inner member 152 and the second inner member 153 can remain fixed to the upper column member 120 and the lower column member 130, respectively. At an installation site, the first fixing member 154 and the second fixing member 155 are reinstalled and the outer member 151 is fixed to the first inner member 152 and the second inner member 153, so that the upper column member 120 and the lower column member 130 can be recoupled. The first and the second positioning units (the first hole 151d, the second hole 151e, the first pin P1, and the second pin P2) specify the locational relationships between the outer member 151 and the first inner member 152 and between the outer member 151 and the second inner member 153, so that the upper column member 120 and the lower column member 130 are coupled so as to replicate the locational relationship adjusted at the factory. Therefore, the adjusted locational relationship can be replicated without any special processing. When a plurality of the column members 110 are coupled at an installation site, the adjusted locational relationship can be easily replicated, which enables improvement in the quality and a reduction in the working time.

In the stacker crane 7, the first hole 151d and the first pin P1 are provided as the first positioning unit, and the second hole 151e and the second pin P2 are provided as the second positioning unit. The first pin P1 is fitted into the first hole 151d, so that the locational relationship between the outer member 151 and the first inner member 152 can be specified. The second pin P2 is fitted into the second hole 151e, so that the locational relationship between the outer member 151 and the second inner member 153 can be specified.

In the stacker crane 7, a plurality of the first holes 151d and a plurality of the first pins P1 are provided and a plurality of the second holes 151e and a plurality of the second pins P2 are provided. Any of the plurality of the first holes 151d and any of the plurality of the second pins P2 are elongated holes. With this configuration, the first pin P1 can be easily fitted into the first hole 151d, and the second pin P2 can be easily fitted into the second hole 151e.

In the stacker crane 7, the coupling structure 150 has the shim plate 170 between the first inner member 152 the upper column member 120 and between the second inner member 153 and the lower column member 130. The first inner member 152 does not need to be removed when being fixed to the upper column member 120, and similarly, the second inner member 153 does not need to be removed when being fixed to the lower column member 130, so that the shim plate 170 intervened therebetween does not need to be removed when being fixed once. Thus, when the plurality of column members 110 are coupled at an installation site, the shim plate 170 does not need to be managed and the adjusted locational relationship can be replicated more easily.

In the stacker crane 7, the coupling structure 150 may be provided at the side wall 101 and the back wall 103 of the upper column member 120 and the lower column member 130. With this configuration, the upper column member 120 and the lower column member 130 can be coupled accurately. Especially, a surface requiring higher accurate coupling (e.g., the inner surface 101*a* of the side wall 101 and the front surface 103*a* of the back wall 103) can be coupled with a sufficiently high accuracy.

In the stacker crane 7, the coupling structure 150 provided at the side wall 101 of the upper column member 120 and the lower column member 130 further includes the front member 158 coupled with the outer member 151 and fixed by the front walls 102 of the upper column member 120 and the lower column member 130. With this configuration, any deformation of the mast 100 (e.g., a distortion such as an expansion of space between the pair of front walls 102) can be prevented effectively.

In the stacker crane 7, in order to improve stiffness of the mast 100 (in order to prevent deformation), a rectangular reinforcement plate 190 (see FIG. 2) is abutted and fixed (tightened) at a position between the coupling structures 150 provided at an upper end and a lower end of outer surface of the side wall 101 of one column member 110. This kind of reinforcement plate 190 does not need to be provided in some cases.

Preferred embodiments are described above, however, aspects of the present invention are not limited to the above preferred embodiments and various changes can be made without departing from the scope of the present invention.

For example, in the above preferred embodiments, the coupling structure 150 may be applied to a stacker crane with a configuration different from the configurations of the above stacker crane 7. In the above preferred embodiments, the container such as a FOUP is described as an example of an article to be transported, however, a reticle pod to store a reticle may be used. A cardboard or a returnable box or the like may be used as an article to be transported. In the above preferred embodiments, a shape or material of each component of the coupling structure 150 is not especially limited and any shapes and materials may be used.

In the above preferred embodiments, the number of the column member 110 included in the mast 100 is not limited and may be two or more. In the above preferred embodiments, the number of the coupling structure 150 is not limited and may be one or more. In the above preferred embodiment, the first fixing member 154, the second fixing member 155, the third fixing member 156, and the fourth fixing member 157 are not limited. For example, other general tightening tools may be used.

In the above preferred embodiments, one or more coupling structures 150 may be provided only at any of the side wall 101 and the back wall 103 of the upper column member 120 and the lower column member 130. In the above preferred embodiments, the intermediate wall coupling plate 160 (see FIG. 3) does not need to be provided. In the above preferred embodiments, the front member 158 (see FIG. 3) does not need to be provided. In the above preferred embodiments, the shim plate 170 (see FIG. 10) may be provided at least one of between the first inner member 152 and the upper column member 120 and between the second inner member 153 and the lower column member 130. Alternatively, in the above preferred embodiments, the shim plate 170 does not need to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A stacker crane comprising:
a mast that includes a plurality of column members coupled with each other in a height direction and an elevating platform movable up and down along the mast; and
a coupling structure to couple a first column member and a second column member of the plurality of column members, which are adjacent to each other; wherein
the coupling structure includes:
an outer member attached over the first column member and the second column member;
a first inner member between the first column member and the outer member;
a second inner member between the second column member and the outer member;
a first fixing member to fix the outer member to the first column member along with the first inner member;
a second fixing member to fix the outer member to the second column member along with the second inner member;
a third fixing member to fix the first inner member to the first column member; and
a fourth fixing member to fix the second inner member to the second column member;
the outer member and the first inner member are provided with a first positioner to specify a locational relationship between the outer member and the first inner member;
the outer member and the second inner member are provided with a second positioner to specify a locational relationship between the outer member and the second inner member; and
the coupling structure includes a shim plate between the first inner member and the first column member or between the second inner member and the second column member.

2. The stacker crane according to claim 1, wherein
the first positioner includes a first hole on one of the outer member and the first inner member and a first pin located at one of the outer member and the first inner member and fitted into the first hole; and
the second positioner includes a second hole on one of the outer member and the second inner member and a second pin located at one of the outer member and the second inner member and fitted into the second hole.

3. The stacker crane according to claim 2, wherein
a plurality of the first holes and a plurality of the first pins are provided;
a plurality of the second holes and a plurality of the second pins are provided; and
any of the plurality of the first holes and any of the plurality of the second holes are elongated holes.

4. The stacker crane according to claim 1, wherein the coupling structure is provided on at least any of a side wall and a back wall of the first column member and the second column member.

5. A stacker crane comprising:
a mast that includes a plurality of column members coupled with each other in a height direction and an elevating platform movable up and down along the mast; and
a coupling structure to couple a first column member and a second column member of the plurality of column members, which are adjacent to each other; wherein the coupling structure includes:
  an outer member attached over the first column member and the second column member;
  a first inner member between the first column member and the outer member;
  a second inner member between the second column member and the outer member;
a first fixing member to fix the outer member to the first column member along with the first inner member;
a second fixing member to fix the outer member to the second column member along with the second inner member;
a third fixing member to fix the first inner member to the first column member; and
a fourth fixing member to fix the second inner member to the second column member;
the outer member and the first inner member are provided with a first positioner to specify a locational relationship between the outer member and the first inner member;
the outer member and the second inner member are provided with a second positioner to specify a locational relationship between the outer member and the second inner member;
the coupling structure is provided on at least any of a side wall and a back wall of the first column member and the second column member; and
the coupling structure provided on the side wall of the first column member and the second column member further includes a front member coupled with the outer member and fixed to a front wall of the first column member and the second column member.

* * * * *